(12) United States Patent
Liang et al.

(10) Patent No.: US 11,417,785 B2
(45) Date of Patent: Aug. 16, 2022

(54) PHOTOVOLTAIC DEVICES AND METHOD OF MAKING

(71) Applicant: First Solar, Inc., Tempe, AZ (US)

(72) Inventors: Yong Liang, Perrysburg, OH (US);
Jinbo Cao, Perrysburg, OH (US);
William Hullinger Huber, Perrysburg, OH (US)

(73) Assignee: First Solar, Inc., Tempe, AZ (US)

( * ) Notice: Subject to any disclaimer, the term of this patent is extended or adjusted under 35 U.S.C. 154(b) by 412 days.

(21) Appl. No.: 15/586,505

(22) Filed: May 4, 2017

(65) Prior Publication Data
US 2017/0236956 A1    Aug. 17, 2017

Related U.S. Application Data

(62) Division of application No. 13/782,176, filed on Mar. 1, 2013, now abandoned.

(51) Int. Cl.
*H01L 31/032* (2006.01)
*H01L 31/0224* (2006.01)
*H01L 31/073* (2012.01)

(52) U.S. Cl.
CPC .. *H01L 31/0321* (2013.01); *H01L 31/022466* (2013.01); *H01L 31/022475* (2013.01);
(Continued)

(58) Field of Classification Search
CPC .................. Y02E 10/50; Y02E 10/541; H01L 31/022425; H01L 31/0322; H01L 31/0749; H01L 31/18; H01L 51/5253
See application file for complete search history.

(56) References Cited

U.S. PATENT DOCUMENTS

| 4,287,383 A | 9/1981 | Peterson |
| 4,532,372 A | 7/1985 | Nath et al. |

(Continued)

FOREIGN PATENT DOCUMENTS

| BE | WO 2012110613 A2 * | 8/2012 | ..... H01L 31/022466 |
| JP | 2012124279 A | 6/2012 | |

(Continued)

OTHER PUBLICATIONS

Hultqvist, "Cadmium Free Buffer Layers and the Influence of their Material Properties on the Perfomance of Cu(In,Ga) Se₂ Solar Cells", Digital Comprehensive Summaries of Uppsala Dissertations from the Faculty of Science and Technology 717, 2010, pp. 1-75.

(Continued)

*Primary Examiner* — Mayla Gonzalez Ramos
(74) *Attorney, Agent, or Firm* — MacMillan, Sobanski & Todd, LLC

(57) ABSTRACT

A photovoltaic device is presented. The photovoltaic device includes a buffer layer disposed on a transparent conductive oxide layer; a window layer disposed on the buffer layer; and an interlayer interposed between the transparent conductive oxide layer and the window layer. The interlayer includes a metal species, wherein the metal species includes gadolinium, beryllium, calcium, barium, strontium, scandium, yttrium, hafnium, cerium, lutetium, lanthanum, or combinations thereof. A method of making a photovoltaic device is also presented.

20 Claims, 5 Drawing Sheets

(52) U.S. Cl.
CPC .... *H01L 31/022483* (2013.01); *H01L 31/073* (2013.01); *Y02E 10/543* (2013.01); *Y02P 70/50* (2015.11)

(56) References Cited

U.S. PATENT DOCUMENTS

| | | | |
|---|---|---|---|
| 5,677,572 | A | 10/1997 | Hung et al. |
| 6,169,246 | B1 | 1/2001 | Wu et al. |
| 8,039,290 | B2 | 10/2011 | Feldman-Peabody et al. |
| 8,247,683 | B2 | 8/2012 | Frey et al. |
| 8,334,455 | B2 | 12/2012 | Gupta et al. |
| 9,034,686 | B2 | 5/2015 | Peng et al. |
| 2003/0052391 | A1 | 3/2003 | Stanbery |
| 2008/0047603 | A1 | 2/2008 | Krasnov |
| 2010/0055826 | A1 | 3/2010 | Zhong et al. |
| 2010/0059112 | A1 | 3/2010 | Gupta et al. |
| 2010/0282320 | A1 | 11/2010 | Meyers et al. |
| 2010/0319757 | A1* | 12/2010 | Oetting ........... H01L 31/022425 136/252 |
| 2011/0120521 | A1 | 5/2011 | Yamaguchi et al. |
| 2011/0139240 | A1 | 6/2011 | Allenic et al. |
| 2011/0139245 | A1 | 6/2011 | Frey et al. |
| 2011/0155208 | A1 | 6/2011 | Wang |
| 2011/0309477 | A1 | 12/2011 | Kimball et al. |
| 2011/0315220 | A1 | 12/2011 | Korevaar et al. |
| 2012/0055534 | A1 | 3/2012 | Leschkies et al. |
| 2012/0060916 | A1 | 3/2012 | den Boer et al. |
| 2012/0067421 | A1 | 3/2012 | Shao et al. |
| 2012/0090678 | A1* | 4/2012 | Sekiguchi ............ H01G 9/2022 136/256 |
| 2012/0132268 | A1* | 5/2012 | Rojo .................. H01L 31/1884 136/256 |
| 2012/0192923 | A1 | 8/2012 | Korevaar et al. |
| 2012/0211082 | A1 | 8/2012 | Akiyama et al. |
| 2013/0019934 | A1 | 1/2013 | Gossman et al. |
| 2013/0019948 | A1 | 1/2013 | Feldman-Peabody |
| 2013/0146133 | A1* | 6/2013 | Lemmon ........... H01L 31/03925 136/256 |
| 2013/0192667 | A1* | 8/2013 | Cao ...................... H01L 31/073 136/255 |
| 2013/0319523 | A1* | 12/2013 | Ballet ............ H01L 31/022466 136/256 |
| 2015/0047699 | A1* | 2/2015 | Barnes ........... H01L 31/022466 136/256 |
| 2016/0190368 | A1 | 6/2016 | Cao et al. |

FOREIGN PATENT DOCUMENTS

| | | |
|---|---|---|
| WO | 2005117139 A1 | 12/2005 |
| WO | 2012110613 A2 | 8/2012 |
| WO | 2013119550 A1 | 8/2013 |

OTHER PUBLICATIONS

Lemmon et al., "Thin Metal Oxide Films to Modify a Window Layer in CdTe-based Solar Cells for Improved Performance", Applied Physics Letters, 2012, vol. 100, Issue 21, pp. 213908-1-213908-4.

Liu et al., "Interface Study of ITO/ZnO and ITO/SnO$_2$ Complex Transparent Conductive Layers and Their Effect on CdTe Solar Cells", International Journal of Photoenergy, 2012, vol. 2013, Article ID 765938, pp. 1-8.

McCandless et al., "Influence of Window and Absorber Layer Processing on Device Operation in Superstrate Thin Film CDTE Solar Cells", Conference Record of the Twenty-Eighth IEEE Photovoltaic Specialists Conference, 2000, Location: Anchorage, AK, pp. 491-494.

Stadler, "Transparent Conducting Oxides-An Up-To-Date Overview", Materials, 2012, vol. 5, pp. 661-683.

Tashkandi et al., "Eliminating Pinholes in CSS Deposited CdS Films", 38th IEEE Photovoltaic Specialists Conference (PVSC), 2012, pp. 000143-000146.

Extended Search Report, Application No. EP14756340.7, dated Oct. 10, 2016.

PCT International Search Report and Written Opinion, Application No. PCT/US2014/019861, dated Jun. 12, 2014.

\* cited by examiner

PHOTOVOLTAIC DEVICES AND METHOD OF MAKING

RELATED APPLICATIONS

This application is a divisional application of, and claims priority to, U.S. application Ser. No. 13/782,176, filed under 35 U.S.C. § 111(a) on Mar. 1, 2013, the entire disclosure of which is expressly incorporated herein by reference for all purposes.

BACKGROUND

The invention generally relates to photovoltaic devices. More particularly, the invention relates to photovoltaic devices that include an interlayer, and methods of making the photovoltaic devices.

Thin film solar cells or photovoltaic (PV) devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. The window layer further functions to form a heterojunction (p-n junction) in combination with an absorber layer. Cadmium telluride/cadmium sulfide (CdTe/CdS) heterojunction-based photovoltaic cells are one such example of thin film solar cells, where CdS functions as the window layer.

However, thin film solar cells may have low conversion efficiencies. Thus, one of the main focuses in the field of photovoltaic devices is the improvement of conversion efficiency. Absorption of light by the window layer may be one of the phenomena limiting the conversion efficiency of a PV device. Thus, it is desirable to keep the window layer as thin as possible to help reduce optical losses by absorption. However, for most of the thin-film PV devices, if the window layer is too thin, a loss in performance can be observed due to low open circuit voltage (Voc) and fill factor (FF). It is also desirable that the thin window layer maintain its structural integrity during the subsequent device fabrication steps, such that the interface between the absorber layer and the window layer contains negligible interface defect states.

Thus, there is a need for improved thin film photovoltaic devices configurations, and methods of manufacturing these.

BRIEF DESCRIPTION OF THE INVENTION

Embodiments of the present invention are included to meet these and other needs. One embodiment is a photovoltaic device. The photovoltaic device includes a buffer layer disposed on a transparent conductive oxide layer; a window layer disposed on the buffer layer; and an interlayer interposed between the transparent conductive oxide layer and the window layer. The interlayer includes a metal species, wherein the metal species includes gadolinium, beryllium, calcium, barium, strontium, scandium, yttrium, hafnium, cerium, lutetium, lanthanum, or combinations thereof.

One embodiment is a photovoltaic device. The photovoltaic device includes a transparent conductive oxide layer; a window layer; and an interlayer interposed between the transparent conductive oxide layer and the window layer. The interlayer includes a metal species, wherein the metal species includes gadolinium, beryllium, scandium, yttrium, hafnium, cerium, lutetium, lanthanum, or combinations thereof.

One embodiment is a method of making a photovoltaic device. The method includes disposing a buffer layer between a transparent conductive oxide layer and a window layer; and disposing an interlayer between the transparent conductive oxide layer and the window layer. The interlayer includes a metal species, wherein the metal species includes gadolinium, beryllium, calcium, barium, strontium, scandium, yttrium, hafnium, cerium, lutetium, lanthanum, or combinations thereof.

DRAWINGS

These and other features, aspects, and advantages of the present invention will become better understood when the following detailed description is read with reference to the accompanying drawings, wherein.

DETAILED DESCRIPTION

Figure 1:
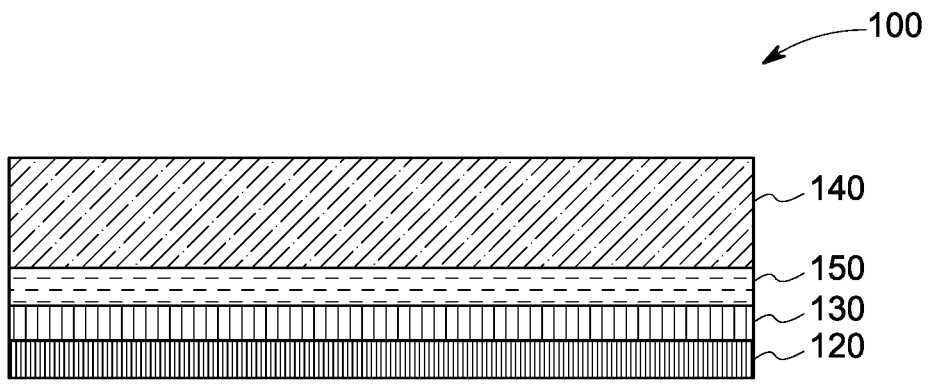
FIG. 1 is a schematic of a photovoltaic device, according to some embodiments of the invention.

As discussed in detail below, some of the embodiments of the invention include photovoltaic devices including an interlayer disposed between a transparent conductive oxide layer and a window layer. In some embodiments, the interlayer is disposed between a buffer layer and a window layer. In some embodiments, the interlayer is disposed between a transparent conductive oxide layer and a buffer layer.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components (for example, a layer) being present and includes instances in which a combination of the referenced components may be present, unless the context clearly dictates otherwise.

The terms "transparent region" and "transparent layer" as used herein, refer to a region or a layer that allows an average transmission of at least 70% of incident electromagnetic radiation having a wavelength in a range from about 350 nm to about 850 nm.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. As used herein, the term "disposed on" refers to layers disposed directly in contact with each other or indirectly by having intervening layers therebetween, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

Figure 2:
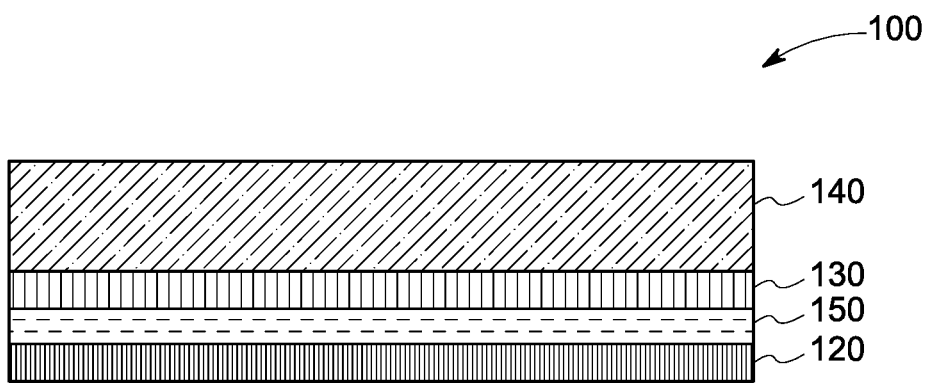
FIG. 2 is a schematic of a photovoltaic device, according to some embodiments of the invention.

As discussed in detail below, some embodiments of the invention are directed to a photovoltaic device including an interlayer. A photovoltaic device 100, according to one embodiment of the invention, is illustrated in FIGS. 1-2. As shown in FIGS. 1-2, the photovoltaic device 100 includes a transparent conductive oxide layer 120, a buffer layer 130 disposed on the transparent conductive oxide layer 120, and a window layer 140 disposed on the buffer layer 130. As indicated in FIGS. 1-2, the photovoltaic device 100 further includes an interlayer 150 interposed between the transparent conductive oxide layer 120 and the window layer 140. In such instances, the interlayer 150 includes a metal species, wherein the metal species include gadolinium, beryllium, scandium, yttrium, hafnium, cerium, lutetium, lanthanum, calcium, barium, strontium, or combinations thereof.

In some embodiments, the interlayer 150 is interposed between the buffer layer 130 and the window layer 140, as indicated in FIG. 1. In some other embodiments, the interlayer 150 is interposed between the transparent conductive oxide layer 120 and the buffer layer 130, as indicated in FIG. 2. Further, in such instances, the interlayer 150 may be disposed directly in contact with buffer layer 130 (as indicated in FIGS. 1 and 2), or, alternatively may be disposed on an intervening layer (embodiment not shown), which in turn is disposed on the buffer layer 130.

Figure 4:
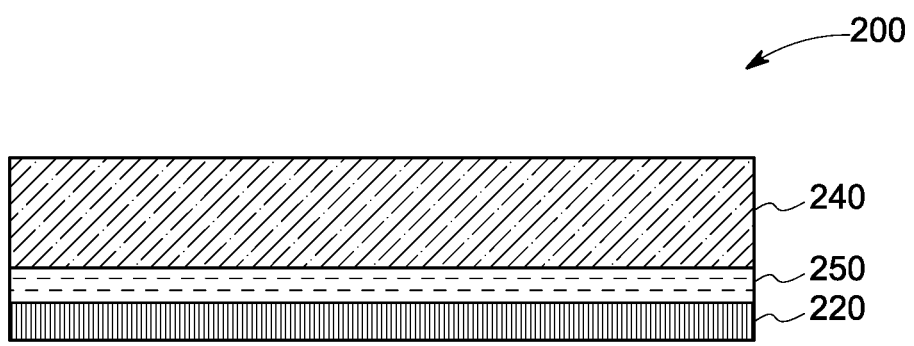
FIG. 4 is a schematic of a photovoltaic device, according to some embodiments of the invention.

A photovoltaic device 200, according to another embodiment of the invention, is illustrated in FIG. 4. As shown in FIG. 4, the photovoltaic device 200 includes a transparent conductive oxide layer 220, and a window layer 240 disposed on the transparent conductive oxide layer 220. As indicated in FIG. 4, the photovoltaic device 200 further includes an interlayer 250 interposed between the transparent conductive oxide layer 220 and the window layer 240. In such instances, the interlayer 250 includes a metal species, wherein the metal species include gadolinium, beryllium, scandium, yttrium, hafnium, cerium, lutetium, lanthanum, or combinations thereof.

In such embodiments, the interlayer 250 may be disposed directly in contact with the transparent conductive oxide layer 220, as indicated in FIG. 4. In such instances, the interlayer 250 may itself function as a buffer layer, and a separate buffer layer may not be required in the photovoltaic device 200.

The term "metal species" as used herein refers to elemental metal, metal ions, or combinations thereof. In some embodiments, at least a portion of the metal species is present in the interlayer 150/250 in the form of an elemental metal, a metal alloy, a metal compound, or combinations thereof. In some embodiments, the interlayer 150/250 further includes tin, sulfur, oxygen, fluorine, zinc, cadmium, or combinations thereof.

In some embodiments, at least a portion of the metal species is present in the interlayer in the form of an elemental metal. In some embodiments, the interlayer 150 includes elemental gadolinium, elemental calcium, elemental barium, elemental strontium, elemental beryllium, elemental scandium, elemental yttrium, elemental hafnium, elemental cerium, elemental lutetium, elemental lanthanum, or combinations thereof. In some embodiments, the interlayer 250 includes elemental gadolinium, elemental beryllium, elemental scandium, elemental yttrium, elemental hafnium, elemental cerium, elemental lutetium, elemental lanthanum, or combinations thereof.

In some embodiments, at least a portion of the metal species is present in the interlayer 150/250 in the form of a metal alloy. In some embodiments, the interlayer 150/250 includes a metal alloy of tin and at least one of the metal species, for example, an alloy of tin and gadolinium. In certain embodiments, the interlayer includes $Gd_xSn_{1-x}$, wherein x is a number greater than 0 and less than 1. In embodiments wherein the interlayer 150/250 includes two or more of the metal species, the interlayer 150/250 may include a metal alloy of two or more of the metal species, for example, an alloy of gadolinium and strontium.

In some embodiments, at least a portion of the metal species is present in the interlayer 150/250 in the form of a metal compound. The term "metal compound", as used herein, refers to a macroscopically homogeneous material (substance) consisting of atoms or ions of two or more different elements in definite proportions, and at definite lattice positions. For example, gadolinium, tin and oxygen have defined lattice positions in the crystal structure of a gadolinium tin oxide compound, in contrast, for example, to tin-doped gadolinium oxide where tin may be a dopant that is substitutionally inserted on gadolinium sites, and not a part of the compound lattice In some embodiments, the metal compound further includes oxygen, sulfur, selenium, tellurium, or combinations thereof. In some embodiments, the metal compound further includes zinc, cadmium, or combinations thereof. In certain embodiments, the interlayer includes a compound including the metal species, tin, and oxygen. In certain embodiments, the interlayer includes a metal compound including the metal species, zinc, tin, and oxygen. In certain embodiments, the interlayer 150/250 includes a metal compound including the metal species and fluorine.

In some embodiments, at least a portion of the metal species is present in the interlayer 130 in the form of a binary metal compound, a ternary metal compound, a quaternary metal compound, or combinations thereof.

The term "binary metal compound" as used herein refers to a compound including the metal species and one other different element. In some embodiments, at least a portion of the metal species is present in the interlayer 150/250 in the form of a binary metal compound, such as, for example, a metal oxide, a metal sulfide, a metal fluoride, a metal selenide, a metal telluride, or mixtures thereof. Thus, by way of example, in certain embodiments, the interlayer may include gadolinium oxide, gadolinium sulfide, gadolinium fluoride, or mixtures thereof.

The term "ternary metal compound" as used herein refers to a compound including the metal species and two other different elements. Thus, by way of example, in certain embodiments, the interlayer 150/250 includes gadolinium tin oxide. The term "quaternary metal compound" as used herein refers to a compound including the metal species and three other different elements. Thus, by way of example, in certain embodiments, the interlayer 150/250 may include gadolinium zinc tin oxide.

In certain embodiments, the interlayer 150/250 includes a metal tin oxide phase. Without being bound by any theory it is believed that the formation of a compound including the metal species, tin, and oxygen may preclude diffusion of tin from the transparent parent conductive oxide layer 120/220, the buffer layer 130, or both to the junction-forming layers.

The interlayer 150/250 may be further characterized by the concentration of the metal species in the interlayer 150/250. In some embodiments, an atomic concentration of the metal species in the interlayer 150/250 may be substantially constant across the thickness of the interlayer 150/250. The term "substantially constant" as used herein means that the concentration of the metal species varies by less than about 5 percent across the thickness of the interlayer 150/250. In some other embodiments, the metal species may be compositionally graded across the thickness of the interlayer 150/250.

In some embodiments, an average atomic concentration of the metal species in the interlayer 150/250 is greater than about 10 percent. In some embodiments, an average atomic concentration of the metal species in the interlayer 150/250 is greater than about 50 percent. In some embodiments, an average atomic concentration of the metal species in the interlayer 150/250 is in a range from about 10 percent to about 99 percent. The term "atomic concentration" as used herein refers to the average number of atoms per unit volume. As noted earlier, the interlayer 150/250 may further include cadmium, sulfur, tin, oxygen, fluorine, or combinations thereof.

The interlayer 150/250 may be further characterized by a thickness. In some embodiments, the interlayer 150/250 has a thickness in a range from about 0.2 nanometers to about 200 nanometers. In some embodiments, the interlayer 150/250 has a thickness in a range from about 0.2 nanometers to about 100 nanometers. In some embodiments, the interlayer 150/250 has a thickness in a range from about 1 nanometer to about 20 nanometers. In some embodiments, it may be desirable to have a thin interlayer, such that there are minimal optical losses in the interlayer 150/250 due to absorption.

As described earlier, the thickness of the window layer 140/240 is typically desired to be minimized in a photovoltaic device to achieve high efficiency. With the presence of the interlayer 150/250, the thickness of the window layer 140/240 (e.g., CdS layer) may be reduced to improve the performance of the present device. Moreover, the present device may achieve a reduction in cost of production because of the use of lower amounts of CdS.

Figure 3:
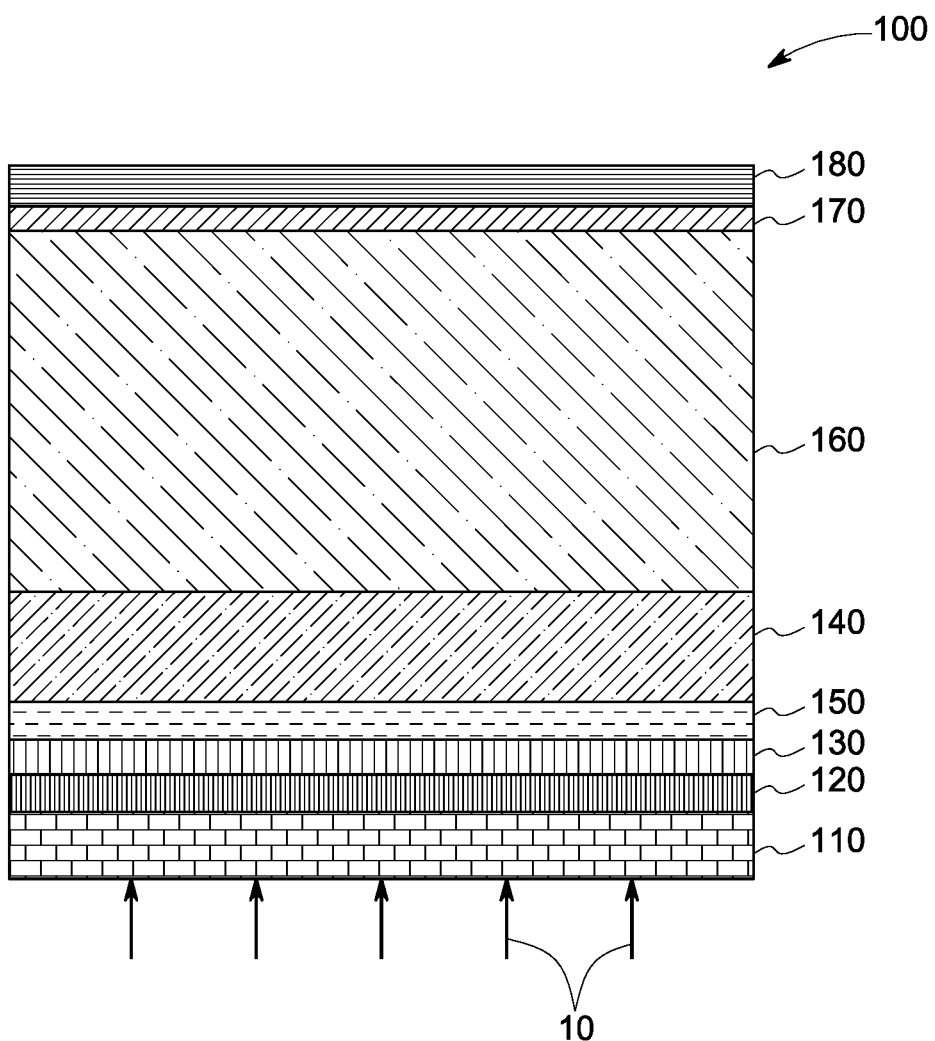
FIG. 3 is a schematic of a photovoltaic device, according to some embodiments of the invention.
Figure 5:
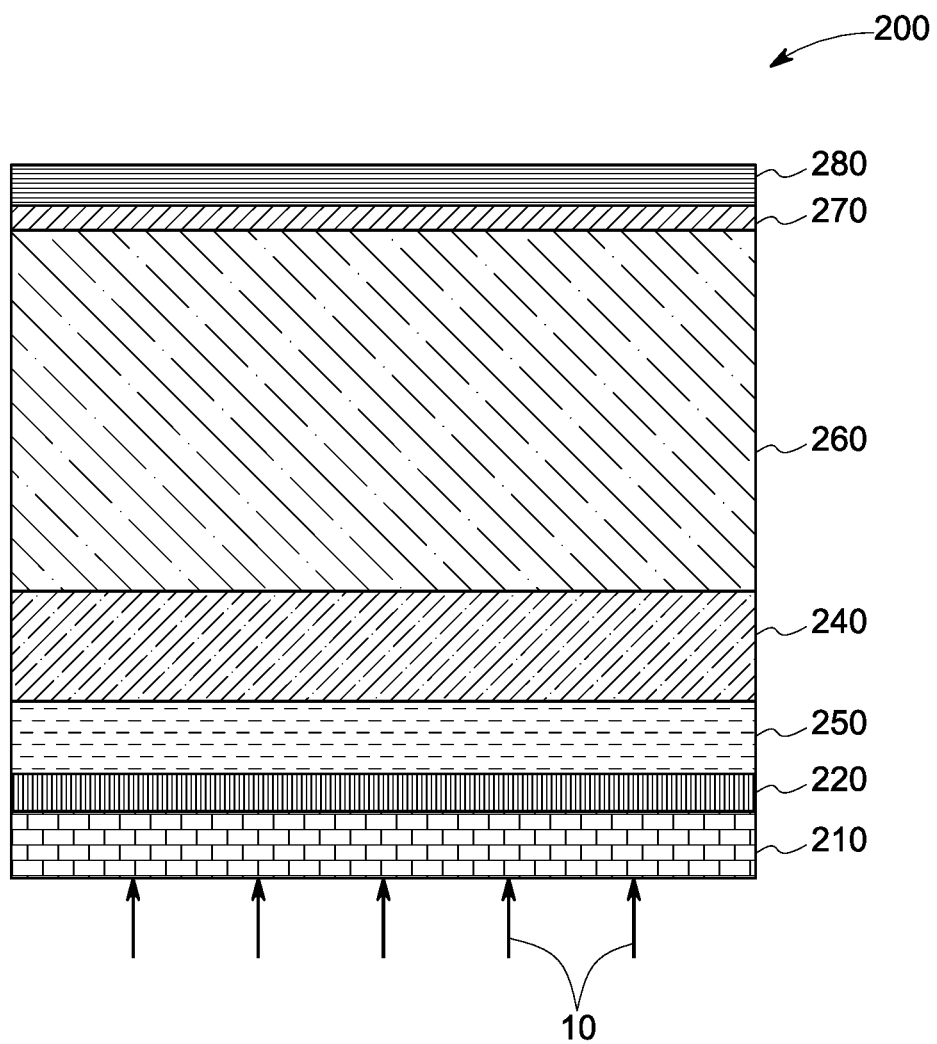
FIG. 5 is a schematic of a photovoltaic device, according to some embodiments of the invention.

As noted, the interlayer 150/250 is a component of a photovoltaic device 100/200. In some embodiments, the photovoltaic device includes a "superstrate" configuration of layers. Referring now to FIGS. 3 and 5, in such embodiments, the photovoltaic device 100/200 further includes a support 110/210, and the transparent conductive oxide layer 120/220 (sometimes referred to in the art as a front contact layer) is disposed on the support 110/220, as indicated in FIGS. 3 and 5. As further illustrated in FIGS. 3 and 5, in such embodiments, the solar radiation 10 enters from the support 110/210, and after passing through the transparent conductive oxide layer 120/220, the buffer layer 130 (if present), the interlayer 150/250, and the window layer 140/240, enters the absorber layer 160/260, where the conversion of electromagnetic energy of incident light (for instance, sunlight) to electron-hole pairs (that is, to free electrical charge) occurs.

In some embodiments, the support 110/210 is transparent over the range of wavelengths for which transmission through the support 110/210 is desired. In one embodiment, the support 110/210 may be transparent to visible light having a wavelength in a range from about 400 nm to about 1000 nm. In some embodiments, the support 110/210 includes a material capable of withstanding heat treatment temperatures greater than about 600° C., such as, for example, silica or borosilicate glass. In some other embodiments, the support 110/210 includes a material that has a softening temperature lower than 600° C., such as, for example, soda-lime glass or a polyimide. In some embodiments certain other layers may be disposed between the transparent conductive oxide layer 120/220 and the support 110/210, such as, for example, an anti-reflective layer or a barrier layer (not shown).

The term "transparent conductive oxide layer" as used herein refers to a substantially transparent layer capable of functioning as a front current collector. In some embodiments, the transparent conductive oxide layer 120/220 includes a transparent conductive oxide (TCO). Non-limiting examples of transparent conductive oxides include cadmium tin oxide ($Cd_2SnO_4$ or CTO); indium tin oxide (ITO); fluorine-doped tin oxide (SnO:F or FTO); indium-doped cadmium-oxide; doped zinc oxide (ZnO), such as aluminum-doped zinc-oxide (ZnO:Al or AZO), indium-zinc oxide (IZO), and zinc tin oxide ($ZnSnO_x$); or combinations thereof. Depending on the specific TCO employed and on its sheet resistance, the thickness of the transparent conductive oxide layer 120/220 may be in a range of from about 50 nm to about 600 nm, in one embodiment.

The term "buffer layer" as used herein refers to a layer interposed between the transparent conductive oxide layer 120 and the window layer 140, wherein the layer 130 has a higher sheet resistance than the sheet resistance of the transparent conductive oxide layer 120. The buffer layer 130 is sometimes referred to in the art as a "high-resistivity transparent conductive oxide layer" or "HRT layer".

Non-limiting examples of suitable materials for the buffer layer 130 include tin dioxide ($SnO_2$), zinc tin oxide (zinc-stannate (ZTO)), zinc-doped tin oxide ($SnO_2$:Zn), zinc oxide (ZnO), indium oxide ($In_2O_3$), or combinations thereof. In some embodiments, the thickness of the buffer layer 130 is in a range from about 50 nm to about 200 nm.

The term "window layer" as used herein refers to a semiconducting layer that is substantially transparent and forms a heterojunction with an absorber layer 160/260 (indicated in FIGS. 3 and 5). Non-limiting exemplary materials for the window layer 140 include cadmium sulfide (CdS), indium III sulfide ($In_2S_3$), zinc sulfide (ZnS), zinc telluride (ZnTe), zinc selenide (ZnSe), cadmium selenide (CdSe), oxygenated cadmium sulfide (CdS:O), copper oxide ($Cu_2O$), zinc oxihydrate (ZnO:H), or combinations thereof. In certain embodiments, the window layer 140/240 includes cadmium sulfide (CdS). In certain embodiments, the window layer 140/240 includes oxygenated cadmium sulfide (CdS:O).

The term "absorber layer" as used herein refers to a semiconducting layer wherein the solar radiation is absorbed. In one embodiment, the absorber layer 160/260 includes a p-type semiconductor material. In one embodiment, the absorber layer 160/260 has an effective carrier density in a range from about $1\times10^{13}$ per cubic centimeter to about $1\times10^{16}$ per cubic centimeter. As used herein, the term "effective carrier density" refers to the average concentration of holes and electrons in a material.

In one embodiment, a photoactive material is used for forming the absorber layer 160/260. Suitable photoactive materials include cadmium telluride (CdTe), cadmium zinc telluride (CdZnTe), cadmium magnesium telluride (CdMgTe), cadmium manganese telluride (CdMnTe), cadmium sulfur telluride (CdSTe), cadmium selenium telluride (CdSeTe), zinc telluride (ZnTe), copper indium disulfide (CIS), copper indium diselenide (CISe), copper indium gallium sulfide (CIGS), copper indium gallium diselenide (CIGSe), copper indium gallium sulfur selenium (CIGSSe), copper indium gallium aluminum sulfur selenium (Cu(In, Ga,Al)(S,Se)$_2$), copper zinc tin sulfide (CZTS), or combinations thereof. The above-mentioned photoactive semiconductor materials may be used alone or in combination. Further, these materials may be present in more than one layer, each layer having different type of photoactive material, or having combinations of the materials in separate layers. In certain embodiments, the absorber layer 160/260 includes cadmium telluride (CdTe). In certain embodiments, the absorber layer 160/260 includes p-type cadmium telluride (CdTe).

In some embodiments, the window layer 140/240, the absorber layer 160/260, or both the layers may contain oxygen. Without being bound by any theory, it is believed that the introduction of oxygen to the window layer 140/240 (e.g., the CdS layer) may result in improved device performance. In some embodiments, the amount of oxygen is less than about 20 atomic percent. In some instances, the amount of oxygen is between about 1 atomic percent to about 10 atomic percent. In some instances, for example in the absorber layer 160/260, the amount of oxygen is less than about 1 atomic percent. Moreover, the oxygen concentration within the window layer 140/240, the absorber layer 160/260, or both the layers may be substantially constant or compositionally graded across the thickness of the respective layer.

In some embodiments, the window layer 140/240 and the absorber layer 160/260 may be doped with a p-type dopant or an n-type dopant to form a heterojunction. As used in this context, a heterojunction is a semiconductor junction that is composed of layers of dissimilar semiconductor material. These materials usually have non-equal band gaps. As an example, a heterojunction can be formed by contact between a layer or region of one conductivity type with a layer or region of opposite conductivity, e.g., a "p-n" junction.

In some embodiments, the window layer 140/240 includes an n-type semiconductor material. In such instances, the absorber layer 160/260 may be doped to be p-type and the window layer 140/240 and the absorber layer 160/260 may form an "n-p" heterojunction. In some embodiments, the window layer 140/240 may be doped to be n-type and the absorber layer 160/260 may be doped such that it effectively forms an n-i-p configuration, using a p+-semiconductor layer on the backside of the absorber layer 160/260.

In some embodiments, the photovoltaic device 100/200 may further include an optional secondary interlayer 155 interposed between the window layer 140/240 and the absorber layer 160/260, as indicated in FIGS. 3 and 5. In such instances, without being bound by any theory, it is believed that the first window layer 140/240 and the absorber layer 160/260 may form a heterojunction, such as, a "p-n" junction or a "n-i-p" junction with the interlayer 155 positioned in between.

In some embodiments, the secondary interlayer 155 includes a metal species including magnesium, aluminum, zinc, nickel, gadolinium, or combinations thereof. The term "metal species" as used in this context refers to elemental metal, metal ions, or combinations thereof. In some embodiments, the secondary interlayer 155 may include a plurality of the metal species. In some embodiments, at least a portion of the metal species is present in the secondary interlayer 150 in the form of an elemental metal, a metal alloy, a metal compound, or combinations thereof. In certain embodiments, the secondary interlayer 155 includes magnesium, gadolinium, or combinations thereof.

In some embodiments, the photovoltaic device 100/200 may further include a p+-type semiconductor layer 170/270 disposed on the absorber layer 160/260, as indicated in FIGS. 3 and 5. The term "p+-type semiconductor layer" as used herein refers to a semiconductor layer having an excess mobile p-type carrier or hole density compared to the p-type charge carrier or hole density in the absorber layer 160/260. In some embodiments, the p+-type semiconductor layer has a p-type carrier density in a range greater than about $1\times10^{16}$ per cubic centimeter. The p+-type semiconductor layer 170/270 may be used as an interface between the absorber layer 160/260 and the back contact layer 180/280, in some embodiments.

In one embodiment, the p+-type semiconductor layer 170/270 includes a heavily doped p-type material including amorphous Si:H, amorphous SiC:H, crystalline Si, microcrystalline Si:H, microcrystalline SiGe:H, amorphous SiGe:H, amorphous Ge, microcrystalline Ge, GaAs, BaCuSF, BaCuSeF, BaCuTeF, LaCuOS, LaCuOSe, LaCuOTe, LaSrCuOS, LaCuOSe$_{0.6}$Te$_{0.4}$, BiCuOSe, BiCaCuOSe, PrCuOSe, NdCuOS, Sr$_2$Cu$_2$ZnO$_2$S$_2$, Sr$_2$CuGaO$_3$S, (Zn,Co,Ni)O$_x$, or combinations thereof. In another embodiment, the p+-type semiconductor layer 170/270 includes a p+-doped material including zinc telluride, magnesium telluride, manganese telluride, beryllium telluride, mercury telluride, arsenic telluride, antimony telluride, copper telluride, or combinations thereof. In some embodiments, the p+-doped material further includes a dopant including copper, gold, nitrogen, phosphorus, antimony, arsenic, silver, bismuth, sulfur, sodium, or combinations thereof.

In some embodiments, the photovoltaic device 100/200 further includes a back contact layer 180/280, as indicated in FIGS. 3 and 5. In some embodiments, the back contact layer 180/280 is disposed directly on the absorber layer 160/260 (embodiment not shown). In some other embodiments, the back contact layer 180/280 is disposed on the p+-type semiconductor layer 170/270 disposed on the absorber layer 160/260, as indicated in FIGS. 3 and 5.

In some embodiments, the back contact layer 180/280 includes gold, platinum, molybdenum, tungsten, tantalum, titanium, palladium, aluminum, chromium, nickel, silver, graphite, or combinations thereof. The back contact layer 180/280 may include a plurality of layers that function together as the back contact.

In some embodiments, another metal layer (not shown), for example, aluminum, may be disposed on the back contact layer 180/280 to provide lateral conduction to the outside circuit. In certain embodiments, a plurality of metal layers (not shown), for example, aluminum and chromium, may be disposed on the back contact layer 180/280 to provide lateral conduction to the outside circuit. In certain embodiments, the back contact layer 180/280 may include a layer of carbon, such as, graphite deposited on the absorber layer 160/260, followed by one or more layers of metal, such as the metals described above.

Figure 6:
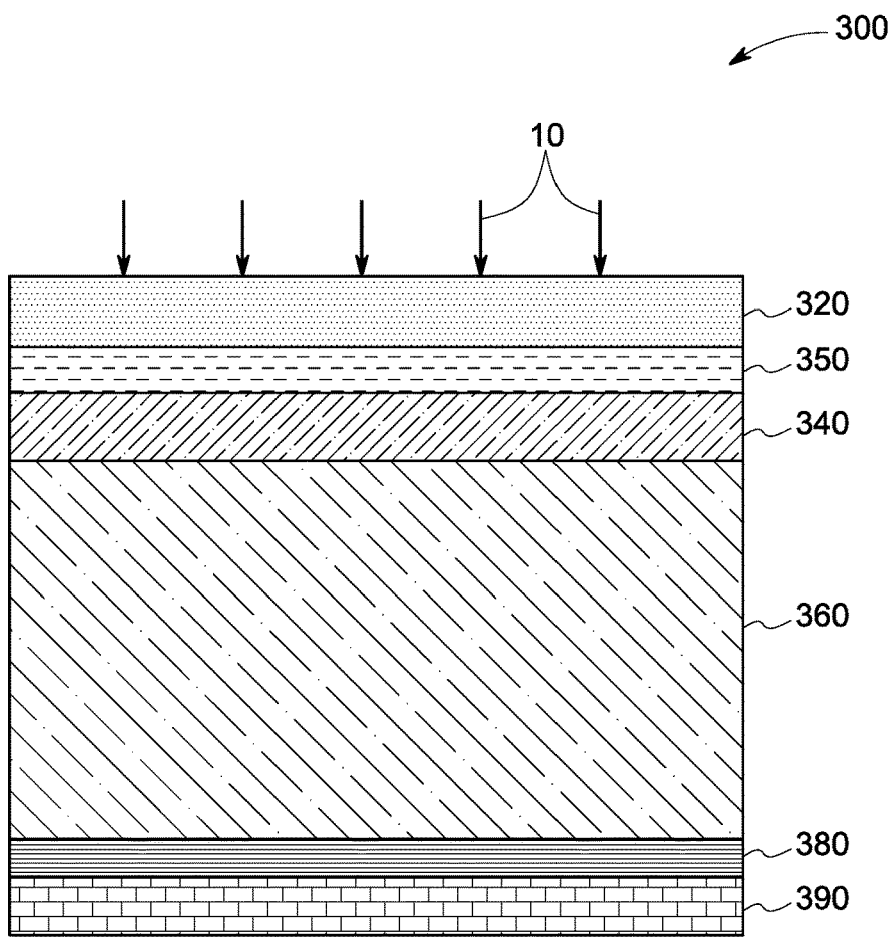
FIG. 6 is a schematic of a photovoltaic device, according to some embodiments of the invention.

In alternative embodiments, as illustrated in FIG. 6, a photovoltaic device 300 including a "substrate" configuration is presented. The photovoltaic device 300 includes a back contact layer 380 disposed on a support 390. Further, an absorber layer 360 is disposed on the back contact layer 380. A window layer 340 is disposed on the absorber layer 360 and an interlayer 350 is disposed on the window layer 340. A transparent conductive oxide layer 320 is further disposed on the interlayer 350, as indicated in FIG. 6. As illustrated in FIG. 6, in such embodiments, the solar radiation 10 enters from the transparent conductive oxide layer 320 and after passing through the interlayer 350 and the window layer 340, enters the absorber layer 360, where the conversion of electromagnetic energy of incident light (for instance, sunlight) to electron-hole pairs (that is, to free electrical charge) occurs.

In some embodiments, the composition of the layers illustrated in FIG. 6, such as, the substrate 310, the transparent conductive oxide layer 320, the window layer 340, the interlayer 350, the absorber layer 360, and the back contact layer 380 may have the same composition as described above in FIG. 5 for the superstrate configuration.

Some embodiments include a method of making a photovoltaic device. In some embodiments, the method generally includes disposing the interlayer 150/250 between the transparent conductive oxide layer 120/220 and the window layer 220/240.

In some embodiments, the method further includes disposing a buffer layer 130 between the transparent conductive oxide layer 120 and the window layer 140. In some embodiments, with continued reference to FIG. 1, the method generally includes disposing the interlayer 150 between the buffer layer 130 and the window layer 140. In some other embodiments, with continued reference to FIG. 2, the method generally includes disposing the interlayer 150 between the transparent conductive oxide layer 120 and the buffer layer 130.

As understood by a person skilled in the art, the sequence of disposing the three layers or the whole device may depend on a desirable configuration, for example, "substrate" or "superstrate" configuration of the device.

Figure 7:
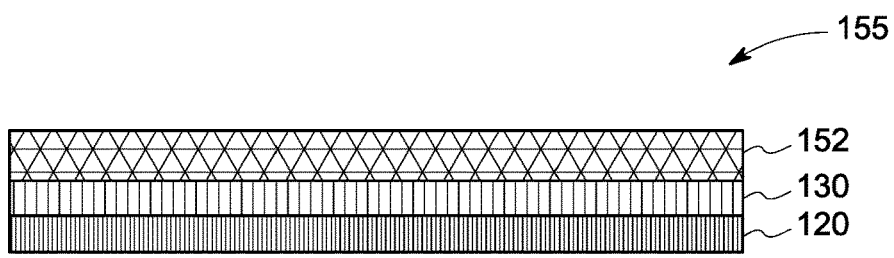
FIG. 7 is a schematic of a semiconductor assembly, according to some embodiments of the invention.
Figure 8:
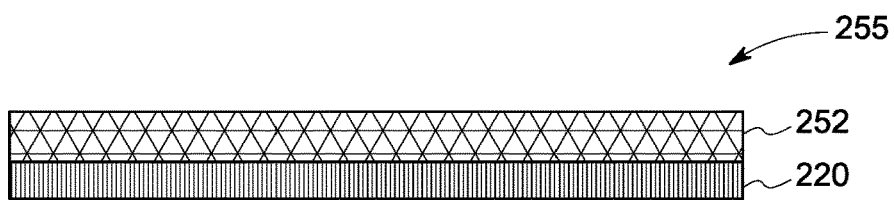
FIG. 8 is a schematic of a semiconductor assembly, according to some embodiments of the invention.

In certain embodiments, a method for making a photovoltaic device 100/200 in superstrate configuration is described. Referring now to FIGS. 7 and 8, in some embodiments, the method includes disposing a capping layer 152/252 on the buffer layer 130 (FIG. 7), or directly on the transparent conductive oxide layer 220 (FIG. 8) to form a semiconductor assembly 155/255.

The capping layer 152/252 includes the metal species. In some embodiments, the metal species is present in the capping layer 152/252 in the form of an elemental metal, a binary metal compound, a metal alloy, or combinations thereof. In certain embodiments, the capping layer 152/252 includes a metal oxide, a metal fluoride, or combinations thereof.

The capping layer 152/252 may be disposed using a suitable deposition technique, such as, for example, sputtering, atomic layer deposition, or combinations thereof. In certain embodiments, the method includes disposing the capping layer 152/252 by atomic layer deposition (ALD). In certain embodiments, the method includes disposing the capping layer 152/252 by sputtering. Without being bound by any theory, it is believed that deposition of the capping layer 152/252 by ALD or sputtering may provide for a more conformal layer in comparison to other deposition methods. A conformal layer may provide for a more uniform contact of the subsequent interlayer 150/250 with the window layer 140/240. Further, deposition of the capping layer by ALD/sputtering may provide for an interlayer 150/250 having lower number of pinholes when compared to layers deposited using other deposition techniques.

The method further includes disposing a window layer 140/240 on the capping layer 152/252. Non-limiting examples of the deposition methods for the window layer 140/240 include one or more of close-space sublimation (CSS), vapor transport deposition (VTD), sputtering (for example, direct current pulse sputtering (DCP), electrochemical deposition (ECD), and chemical bath deposition (CBD).

The method further includes forming an interlayer 150/250. The interlayer composition and configuration are as described earlier. The step of forming the interlayer 150/250 may be effected prior to, simultaneously with, or after the step of disposing the window layer 140/240 on the capping layer 152/252.

In some embodiments, the interlayer 150/250 may be formed prior to the step of disposing the window layer 140/240. In such instances, the method may further include a step of thermally processing the semiconductor assembly 155/255. The step of thermal processing may include, for example, annealing of the semiconductor assembly 155/255.

In some other embodiments, the interlayer 150/250 may be formed simultaneously with the step of disposing the window layer 140/240. In some embodiments, the interlayer 150/250 may be formed after the step of disposing the window layer 140/240, for example, during the high-temperature absorber layer (e.g., CdTe) deposition step, during the cadmium chloride treatment step, during the p+-type layer formation step, during the back contact formation step, or combinations thereof.

In some embodiments, the step of interlayer 150/250 formation may further include intermixing of at least a portion of the metal species in the capping layer 152/252 with at least portion of the transparent conductive oxide layer 120/220 material, the buffer layer 130 material, or both. Without being bound by any theory, it is believed that during the window layer-deposition step or the post-deposition processing steps, recrystallization and chemical changes may occur in the capping layer 152/252, and a metal compound or a metal alloy may be formed in the resultant interlayer 150/250.

In some instances, the method may further result in formation of oxides of the metal species in the capping layer 152/252, and one or more of the metal species present in the transparent conductive oxide layer 120/220 or the buffer layer 130, during the interlayer 150/250 formation. In some instances, the method may result in formation of a metal compound including the metal species, tin, and oxygen during the interlayer 150/250 formation, for example, gadolinium tin oxide. In some instances, the method may result in formation of a metal compound including the metal species, zinc, tin, and oxygen during the interlayer 150/250 formation, for example, gadolinium zinc tin oxide.

As noted earlier, the photovoltaic device may further include one or more additional layers, for example, a support 110/210, an absorber layer 160/260, a p+-type semiconductor layer 170/270, and a back contact layer 180/280, as depicted in FIGS. 3 and 5.

In some embodiments, the method further includes disposing the transparent conductive oxide layer 120/220 on a support 110/210, as indicated in FIGS. 3 and 5. The transparent conductive oxide layer 120/220 is disposed on the support 110/210 by any suitable technique, such as sputtering, chemical vapor deposition, spin coating, spray coating, or dip coating. Referring to FIG. 3, in some embodiments, a buffer layer 130 may be deposited on the transparent conductive oxide layer 120 using sputtering.

The method further includes disposing an absorber layer 160/260 on the window layer 140/240. In one embodiment, the absorber layer 160/260 may be deposited using a suitable method, such as, close-space sublimation (CSS), vapor transport deposition (VTD), ion-assisted physical vapor deposition (IAPVD), radio frequency or pulsed magnetron sputtering (RFS or PMS), plasma enhanced chemical vapor deposition (PECVD), or electrochemical deposition (ECD).

In some embodiments, a series of post-forming treatments may be further applied to the exposed surface of the absorber layer 160/260. These treatments may tailor the functionality of the absorber layer 160/260 and prepare its surface for subsequent adhesion to the back contact layer(s) 180/280. For example, the absorber layer 160/260 may be annealed at elevated temperatures for a sufficient time to create a quality p-type layer. Further, the absorber layer 160/260 may be treated with a passivating agent (e.g., cadmium chloride) and a tellurium-enriching agent (for example, iodine or an iodide) to form a tellurium-rich region in the absorber layer 160/260. Additionally, copper may be added to the absorber layer 160/260 in order to obtain a low-resistance electrical contact between the absorber layer 160/260 and a back contact layer(s) 180/280.

Referring again to FIGS. 3 and 5, a p+-type semiconducting layer 170/270 may be further disposed on the absorber layer 160/260 by depositing a p+-type material using any suitable technique, for example PECVD or sputtering. In an alternate embodiment, as mentioned earlier, a p+-type semiconductor region may be formed in the absorber layer 160/260 by chemically treating the absorber layer 160/260 to increase the carrier density on the back-side (side in contact with the metal layer and opposite to the window layer) of the absorber layer 160/260 (for example, using iodine and copper). In some embodiments, a back contact layer 180/280, for example, a graphite layer may be deposited on the p+-type semiconductor layer 170/270, or directly on the absorber layer 160/260 (embodiment not shown). A plurality of metal layers may be further deposited on the back contact layer 180/280.

One or more of the window layer 140/240, the absorber layer 160/260, the back contact layer 180/280, or the p+type layer 170/270 (optional) may be further heated or subsequently treated (for example, annealed) after deposition to manufacture the photovoltaic device 100/200.

In some embodiments, other components (not shown) may be included in the exemplary photovoltaic device 100/200, such as, buss bars, external wiring, laser etches, etc. For example, when the device 100/200 forms a photovoltaic cell of a photovoltaic module, a plurality of photovoltaic cells may be connected in series in order to achieve a desired voltage, such as through an electrical wiring connection. Each end of the series connected cells may be attached to a suitable conductor such as a wire or bus bar, to direct the generated current to convenient locations for connection to a device or other system using the generated current. In some embodiments, a laser may be used to scribe the deposited layers of the photovoltaic device 100/200 to divide the device into a plurality of series connected cells.

EXAMPLES

Comparative Example 1 Method of Manufacturing a Cadmium Telluride Photovoltaic Device, without an Interlayer A cadmium telluride photovoltaic device was made by depositing several layers on a cadmium tin oxide (CTO) transparent conductive oxide (TCO)-coated substrate. The substrate was a 1.4 millimeters thick PVN++ glass, which was coated with a CTO transparent conductive oxide layer and a thin high resistance transparent zinc tin oxide (ZTO) buffer layer. The window layer containing cadmium sulfide (CdS:O, 5 molar % oxygen in the CdS layer) was then deposited on the ZTO layer by DC sputtering followed by deposition of cadmium telluride (CdTe) layer at 550° C., and back contact formation.

Example 1 Method of Manufacturing a Cadmium Telluride Photovoltaic Device Including an Interlayer Between the Buffer Layer and the CdS Layer The method of making the photovoltaic device was similar to the Comparative Example 1, except a capping layer of varying thickness (3 nm and 6 nm) was deposited by sputtering on the ZTO buffer layer to form an interlayer, prior to the deposition of the CdS layer. The capping layer included elemental gadolinium, elemental calcium, elemental strontium, hafnium oxide, or yttrium oxide.

Figure 9:
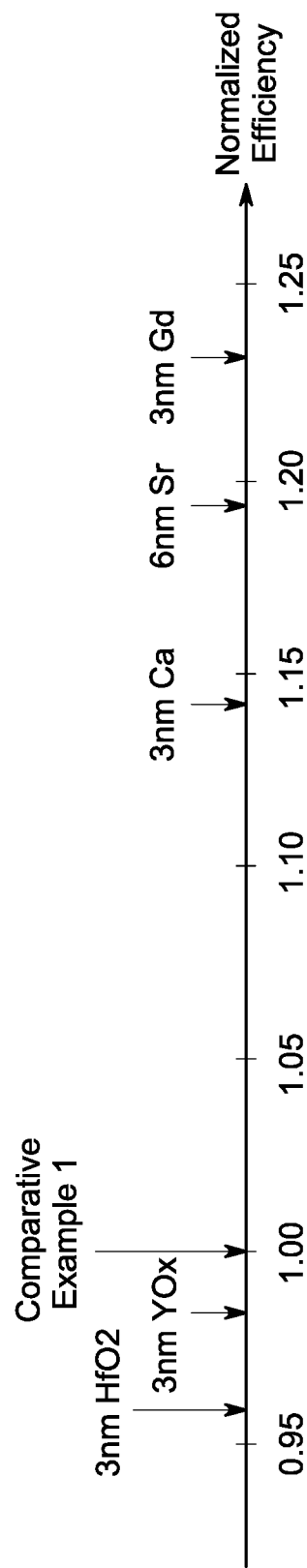
FIG. 9 shows the performance parameters for photovoltaic devices, according to some embodiments of the invention.

FIG. 9 illustrates the device efficiency values (normalized with respect to Comparative Example 1) for devices with and without an interlayer. As illustrated in FIG. 9, the efficiency values showed improvement for the devices including Ca, Sr, or Gd-based interlayer, when compared to the device without the interlayer (Comparative Example 1). Further, the efficiency values for devices including Y or Hf-based interlayers were comparable to the efficiency value for the device without the interlayer (Comparative Example 1).

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

What is claimed is:

1. A photovoltaic device, comprising:
a transparent conductive oxide layer;
a semiconducting layer;
a buffer layer interposed between the transparent conductive oxide layer and the semiconducting layer; and
an interlayer comprising a metal species disposed directly in contact with the buffer layer between the transparent conductive oxide layer and the semiconducting layer, wherein:
the metal species comprises gadolinium, beryllium, calcium, barium, strontium, scandium, yttrium, hafnium, lutetium, lanthanum, or combinations thereof,
an average atomic concentration of the metal species in the interlayer is in a range from about 10 percent to about 99 percent, and
the interlayer has a thickness in a range from about 0.2 nanometers to about 200 nanometers.

2. The photovoltaic device of claim 1, wherein at least a portion of the metal species is present in the interlayer in the form of an elemental metal, a metal alloy, a metal compound, or combinations thereof.

3. The photovoltaic device of claim 1, wherein the semiconducting layer comprises cadmium sulfide, oxygenated cadmium sulfide, zinc sulfide, cadmium zinc sulfide, cadmium selenide, indium selenide, indium sulfide, indium III sulfide, zinc telluride, zinc selenide, copper oxide, zinc oxihydrate, or combinations thereof.

4. The photovoltaic device of claim 1, wherein the interlayer further comprises tin, sulfur, oxygen, fluorine, zinc, cadmium, or combinations thereof.

5. The photovoltaic device of claim 1, wherein the interlayer comprises a metal compound comprising the metal species, tin, and oxygen, or a metal compound comprising the metal species and fluorine.

6. The photovoltaic device of claim 1, wherein:
the transparent conductive oxide layer comprises cadmium tin oxide, zinc tin oxide, indium tin oxide, fluorine-doped tin oxide, indium-doped cadmium-oxide, doped zinc oxide, or combinations thereof; and
the buffer layer comprises tin dioxide, zinc oxide, indium oxide, zinc tin oxide, or combinations thereof.

7. The photovoltaic device of claim 1, further comprising an absorber layer disposed on the semiconducting layer, wherein the absorber layer comprises cadmium telluride, cadmium zinc telluride, cadmium sulfur telluride, cadmium selenium telluride, cadmium manganese telluride, copper indium sulfide, copper indium gallium selenide, copper indium gallium sulfide, or combinations thereof.

8. The photovoltaic device of claim 7, further comprising a secondary interlayer interposed between the semiconducting layer and the absorber layer, wherein the secondary interlayer comprises magnesium, aluminum, zinc, nickel, gadolinium, or combinations thereof.

9. The photovoltaic device of claim 1, wherein the interlayer has a thickness in a range from about 0.2 nanometers to about 20 nanometers.

10. A method of making a photovoltaic device, comprising:
disposing a buffer layer over a transparent conductive oxide layer;
disposing an interlayer comprising a metal species adjacent the buffer layer, wherein:
the interlayer has a thickness in a range from about 0.2 nanometers to about 200 nanometers;
the metal species comprises gadolinium, beryllium, scandium, yttrium, hafnium, lutetium, lanthanum, calcium, barium, strontium, or combinations thereof; and,
an average atomic concentration of the metal species in the interlayer is in a range from about 10 percent to about 99 percent;
disposing a semiconducting layer over the interlayer; and
disposing an absorber layer over the semiconducting layer.

11. The method of claim 10, further comprising interposing a secondary interlayer between the semiconducting layer and the absorber layer, wherein the secondary interlayer comprises magnesium, aluminum, zinc, nickel, gadolinium, or combinations thereof.

12. The method of claim 10, wherein the absorber layer comprises cadmium telluride, cadmium zinc telluride, cadmium sulfur telluride, cadmium selenium telluride, cadmium manganese telluride, cadmium magnesium telluride, copper indium sulfide, copper indium gallium selenide, copper indium gallium sulfide, or combinations thereof.

13. The method of claim 10, wherein the semiconducting layer comprises cadmium sulfide, oxygenated cadmium sulfide, zinc sulfide, cadmium zinc sulfide, cadmium selenide, indium selenide, indium sulfide, indium III sulfide, zinc telluride, zinc selenide, copper oxide, zinc oxihydrate, or combinations thereof.

14. The method of claim 10, wherein the interlayer has a thickness in a range from about 0.2 nanometers to about 20 nanometers.

15. A photovoltaic device, comprising:
a buffer layer disposed on a transparent conductive oxide layer;
a semiconducting layer disposed on the buffer layer;
an interlayer comprising a metal species interposed between the buffer layer and the semiconducting layer, wherein at least a portion of the metal species is present in the interlayer in the form of an elemental metal, and wherein the metal species comprises gadolinium, beryllium, calcium, barium, strontium, scandium, yttrium, hafnium, cerium, lutetium, lanthanum, or combinations thereof;
an absorber layer disposed on the semiconducting layer; and
a back contact layer disposed on the absorber layer.

16. The photovoltaic device of claim 15, wherein the semiconducting layer comprises cadmium selenide.

17. The photovoltaic device of claim 1, wherein the interlayer comprises $Gd_xSn_{1-x}$, wherein x is a number greater than 0 and less than 1.

18. The photovoltaic device of claim 1, wherein an average atomic concentration of the metal species in the interlayer is in a range from about 50 percent to about 99 percent.

19. The photovoltaic device of claim 1, wherein the interlayer is disposed between the buffer layer and the transparent conductive oxide layer.

20. The photovoltaic device of claim 1, wherein the interlayer is disposed between the buffer layer and the semiconducting layer.

* * * * *